(12) United States Patent
Kobayashi

(10) Patent No.: US 6,630,704 B2
(45) Date of Patent: Oct. 7, 2003

(54) SEMICONDUCTOR DEVICE

(75) Inventor: Kazuo Kobayashi, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 09/944,204

(22) Filed: Sep. 4, 2001

(65) Prior Publication Data

US 2002/0033489 A1 Mar. 21, 2002

(30) Foreign Application Priority Data

Sep. 5, 2000 (JP) ........................................ 2000-268276
Aug. 13, 2001 (JP) ........................................ 2001-245391

(51) Int. Cl.$^7$ ............................................ H01L 27/108
(52) U.S. Cl. .................... 257/298; 257/311; 257/314; 257/324
(58) Field of Search ................... 257/298–325

(56) References Cited

U.S. PATENT DOCUMENTS

| | | | |
|---|---|---|---|
| 5,528,542 A | * | 6/1996 | Okamura |
| 6,014,193 A | * | 1/2000 | Taira et al. |

FOREIGN PATENT DOCUMENTS

| | | |
|---|---|---|
| JP | 63-188890 | 8/1988 |
| JP | 04-253371 | 9/1992 |
| JP | 07-045722 | 2/1995 |
| JP | 09-074172 | 3/1997 |
| JP | 10-022402 | 1/1998 |
| JP | 10-064788 | 3/1998 |
| JP | 10-150151 | 6/1998 |

OTHER PUBLICATIONS

U.S. patent application Ser. No. 09/944,206, Matsuyama, filed Sep. 4, 2001, (Atty. docket # 110459).

* cited by examiner

*Primary Examiner*—Fetsum Abraham
(74) *Attorney, Agent, or Firm*—Oliff & Berridge, PLC

(57) ABSTRACT

The invention reduces capacitor coupling between data read bit lines and data write bit lines to thereby prevent error detection of data. A first pair of bit lines BM and $\overline{BM}$ that read data from a specified one of memory cells in a memory cell column and a second pair of bit lines BS and $\overline{BS}$ that write data in another specified one of the memory cells in the memory cell column are formed in different layers through an interlayer dielectric film. As viewed in a plan view, the space between the first pair of bit lines BM and $\overline{BM}$ is wider than the second pair of bit lines BS and $\overline{BS}$, and the second pair of bit lines BS and $\overline{BS}$ are disposed between the first pair of bit lines BM and $\overline{BM}$. A first wiring layer that is set a ground potential is disposed in the same layer as the first pair of bit lines BM and $\overline{BM}$ and between the first pair of bit lines BM and $\overline{BM}$. Second and third wiring layers that are set at a ground potential are disposed in the same layer as the second pair of bit lines BS and $\overline{BS}$ and opposite to the respective bit lines of the first pair of bit lines BM and $\overline{BM}$ with the interlayer dielectric film being interposed therebetween.

15 Claims, 4 Drawing Sheets

SEMICONDUCTOR DEVICE

BACKGROUND OF THE INVENTION

1. Field of Invention

The present invention relates to a semiconductor device with a memory having multiple ports built therein.

2. Description of Related Art

A memory device, referred to as a 2-port RAM or a dual port RAM, is known. This type of RAM is capable of writing data in a certain memory cell through one port, and reading data from another memory cell through another port at the same time. This type of RAM requires two word lines and two pairs of bit lines for one memory cell.

In recent years, processes have been developed for manufacturing even more miniaturized semiconductor devices, and memory devices with greater memory capacity have been developed.

When a memory device having many memory cells is manufactured using the miniaturization process, and data reading and writing are performed, in some instances, it has been confirmed that read data are different from data written. It has been determined that these incidents result from the fact that bit signals read out through bit line pairs are erroneously detected.

SUMMARY OF THE INVENTION

Accordingly, it is an object of the present invention to provide a semiconductor device in which data read out from memory cells are not erroneously detected.

It is another object of the present invention to provide a semiconductor device that can reduce capacitor coupling between data read lines and data write lines.

It is still another object of the present invention to provide a semiconductor device that can prevent interference between data read lines and data write lines.

It is a further object of the present invention to provide a semiconductor device that can prevent interference between bit lines.

A semiconductor device in accordance with the present invention includes:

a plurality of memory cells arranged in a column direction;

a plurality of word lines arranged along a row direction, and capable of asynchronously selecting any two of the plurality of memory cells;

a first data line extending along the column direction and commonly used by the plurality of memory cells, which is to be connected to a selected one of the memory cells;

a second data line extending along the column direction and commonly used by the plurality of memory cells, which is to be connected to another selected one of the memory cells, the first data line and the second data line being formed in different layers; and an interlayer dielectric film being interposed between the first and second data lines.

DETAILED DESCRIPTION OF PREFERRED EMBODIMENTS

Figure 1:
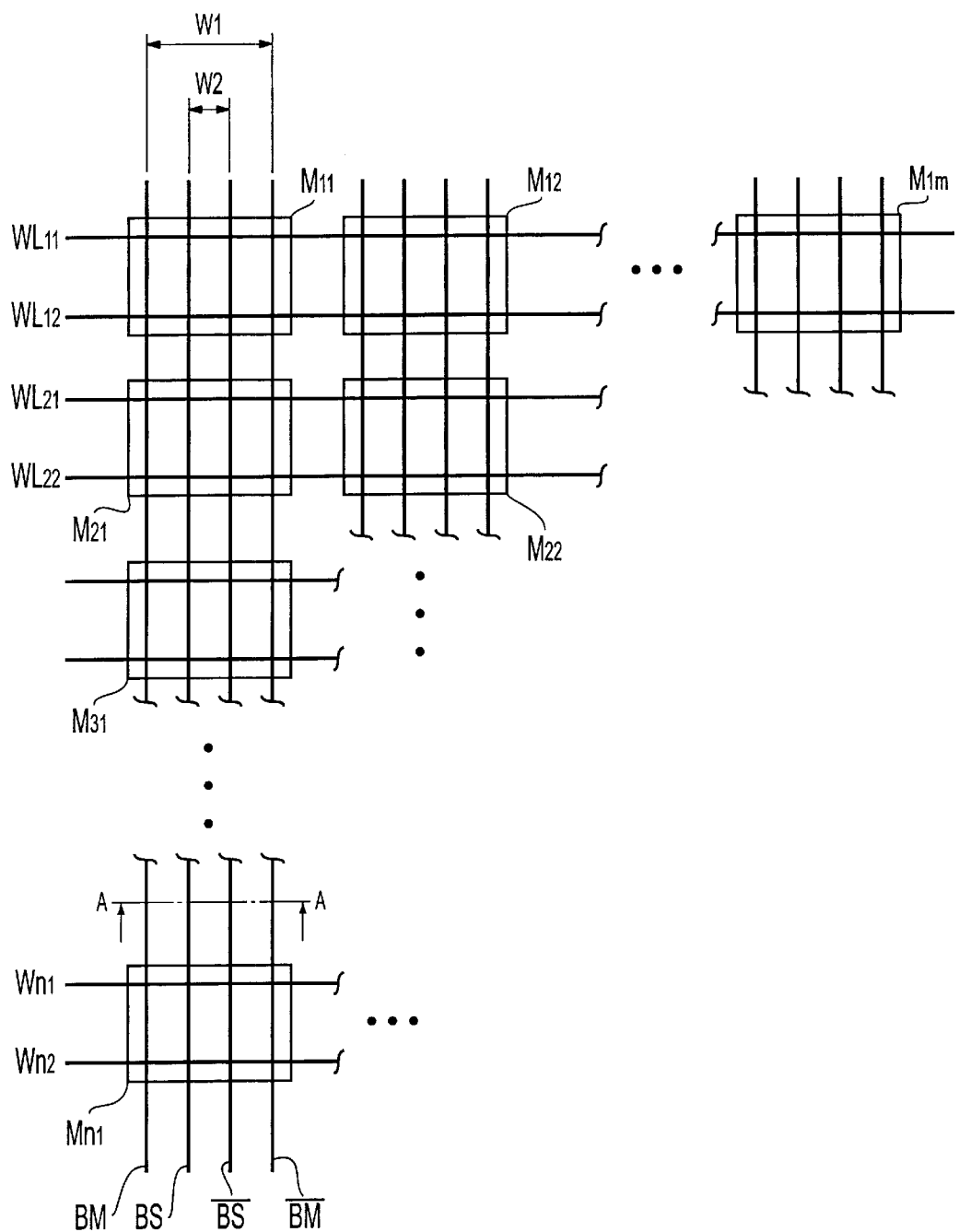
FIG. 1 schematically shows a plan view of a memory region included in a semiconductor device in which the present invention is applied.

A semiconductor device in accordance with an embodiment of the present invention includes:

a plurality of memory cells arranged in a column direction;

a plurality of word lines arranged along a row direction, and capable of asynchronously selecting any two of the plurality of memory cells;

a first data line extending along the column direction and commonly used by the plurality of memory cells, which is to be connected to a selected one of the memory cells;

a second data line extending along the column direction and commonly used by the plurality of memory cells, which is to be connected to another selected one of the memory cells, the first data line and the second data line being formed in different layers; and an interlayer dielectric film being interposed between the first and second data lines.

In accordance with the embodiment of the present invention, at least the thickness of the interlayer dielectric film can be provided as the distance between the first and second data lines. Therefore, the coupling capacitance to be generated between the first and second data lines can be reduced. For this reason, even when data is written through one of the first data line and the second data line, and data is asynchronously read out through the other, the read data can be prevented from being erroneously detected due to the capacitance coupling.

The first data line and the second data line may preferably be formed at positions not opposing each other, with the interlayer dielectric film being interposed therebetween. This is more preferred because the first and second data lines can be separated from one another by a distance that is greater than the film thickness of the interlayer dielectric film In this case, a first wiring layer can be provided that is set at a ground potential and disposed in the same layer as the first data line opposite to the second data line, with the interlayer dielectric film being interposed therebetween. A second wiring layer can be provided that is set at a ground potential and disposed in the same layer as the second data line opposite to the first data line, with the interlayer dielectric film being interposed therebetween. In this manner, the shield effect created by the first and second wiring layers can reduce mutual influences between the first and second data lines.

By mutually connecting the first and second wiring layers by a via, a greater shield effect can be expected.

The interlayer dielectric film may be divided into two layers, including first and second interlayer dielectric films. In this case, a wiring layer that is set at a ground potential may also be provided in a region defined by the first data line and the second data line opposing each other, and between the first and second interlayer dielectric films.

As a result, even when the first data line and the second data line are disposed in an up-and-down relationship and opposite to each other, the first and second data lines are separated from one another by the first and second interlayer dielectric films and wiring layers, and are shielded by the wiring layers.

Here, the first data line may include a first pair of bit lines through which signals having mutually different logics are transmitted. Similarly, the second data line may include a second pair of bit lines through which signals having mutually different logics are transmitted.

Also, as viewed in a plan view, a gap between the bit lines of the first pair of bit lines may be wider than a gap between the bit lines of the second pair of bit lines, and the second pair of bit lines may be disposed between the first pair of bit lines.

As a result, the mutual influence between the bit lines that form the first pair of bit lines is reduced. This structure is preferable when the first pair of bit lines is exclusively used to read data, and the second pair of bit lines is exclusively used for writing data. This is preferred because the bit line pair that reads data would more likely damage data than the bit line pair that writes data.

A first wiring layer that is set at a ground potential may be further provided in the same layer of the first pair of bit lines and between the first pair of bit lines. This is preferred because the bit lines in the first bit line pair can be further separated from each other by the shield effect of the first wiring layer.

Second and third wiring layers, that are set at a ground potential and disposed respectively opposite to each other with the respective bit lines of the first pair of bit lines, and the interlayer dielectric film being interposed therebetween, may be further provided in the same layer as the second pair of bit lines. As a result, each of the plurality of bit lines that form the first and second bit line pairs can be shielded.

In this instance, the first and second wiring layers and the first and third wiring layers may be connected by vias, respectively, with the result that even a greater shield effect is secured The embodiment of the present invention may preferably be implemented in a semiconductor device which is manufactured using a deep sub-micron process for lines and space having a minimum width of 0.25 $\mu$m or less. This is preferred because, if data lines and bit lines are carelessly disposed in such a semiconductor device, problems caused by capacitance coupling may occur.

The embodiment of the present invention can be implemented in a memory having a large memory capacity, such as one with, for example, a total number of multiple memory cells arranged in the column direction that is 280 or greater. This is preferred because, when data lines and bit lines, that are closely disposed to one another, are capacitor-coupled, data may be erroneously detected.

The embodiment of the present invention may be particularly preferable when the total number of 280 or greater multiple memory cells arranged in the column direction are formed using a miniaturization process of 0.25 $\mu$m or less. This is preferred because error data detection becomes more noticeable since the minimum width of lines and spaces is 0.4 $\mu$m or less, the inter-line space becomes narrower and the wiring capacitance itself increases. In this way, the embodiment of the present invention may be preferable when memory cells having the minimum width of lines and spaces of 0.4 $\mu$m or less are formed. Here, lines and space refer to a pitch between adjacent wiring patterns formed in an identical layer.

Embodiments of the present invention are described with reference to the accompanying drawings. FIG. 1 schematically shows a memory region that is included in a semiconductor device. Semiconductor devices in which the present invention is applied may be any of those which include memories. In addition to semiconductor memories on which only memory devices are mounted on one chip, the invention may also be applicable to one that includes memories as an embedded IC.

Description of Memory Cell

Referring to FIG. 1, the semiconductor device has a 2-port RAM having a total of (m×n) memory cells M11–Mmn disposed in a matrix of m memory cells in a row direction and n memory cells in a column direction.

Figure 2:
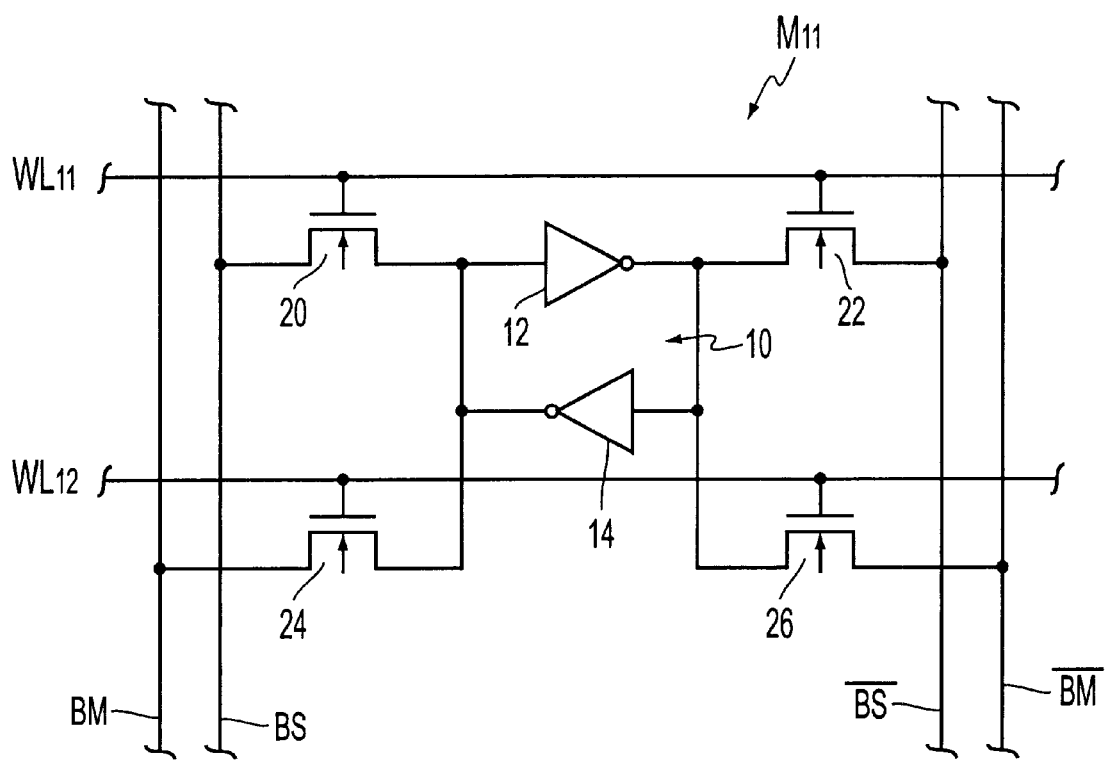
FIG. 2 schematically shows an enlarged explanatory illustration of one of memory cell groups.

Each of the memory cells M11–Mmn has the same structure, and one of them, the memory cell M11, is shown in FIG. 2.

Referring to FIG. 2, the memory cell M11 has a flip-flop 10 that is formed of two inverters I2 and I4 connected in a loop configuration. The flip-flop 10 is connected to a pair of bit lines BM and $\overline{BM}$, and a pair of bit lines BS and $\overline{BS}$ through first–fourth transistors 20, 22, 24 and 26 that are formed from, for example, N-type MOS transistors that are driven by first and second word lines WL11 and WL12. The pair of bit lines BM and $\overline{BM}$ transfer signals having mutually opposite logics. When a potential on the bit line BM is HIGH, a potential on the bit line $\overline{BM}$ is LOW. This relationship similarly applies to the pair of bit lines BS and $\overline{BS}$.

Here, the first and second word lines WL11 and WL12 are commonly used by the memory cells M11, M12, . . . M1m in the first row. As shown in FIG. 1, the first and second word lines WL21, WL22, . . . WLn1, WLn2 that are commonly used by other memory cell groups are provided.

By selecting one of the first word lines WL11, WL21, . . . WLn1, memory cells in a specified row can be selected. By selecting one of the second word lines WL12, WL22, . . . WLn2 asynchronously with the aforementioned selection operation, memory cells in another row can be selected.

Also, referring to FIG. 2, when the first word line WL11 is selected, the first and second transistors 20 and 22 turn on, with the result that the flip-flop 10 is connected to the pair of bit lines BS and $\overline{BS}$. Accordingly, data from an MPU can be written in the memory cell M11 through the pair of bit lines BS and $\overline{BS}$.

In the 2-port RAM shown in FIG. 1, during the period when the memory cell M11 is being selected, another memory cell, belonging to the same column that includes the memory cell M11, can be selected.

For example, when the second word line WL21 is selected in the second row, the flip-flop 10 in the memory cell M21 is connected to the pair of bit lines BM and $\overline{BM}$. Accordingly, data can be read out from the memory cell M21 through the pair of bit lines BM and $\overline{BM}$, and output to MPU.

Here, the pair of bit lines BM and $\overline{BM}$ can be exclusively used to read data, and the pair of bit lines BS and $\overline{BS}$ can be exclusively used to write data, or they may be used vice versa. However, without being limited to this example, both of the pair of bit lines BM and $\overline{\text{BM}}$ and the pair of bit lines BS and $\overline{\text{BS}}$ can be used for both of data wiring and data reading.

Cross-Sectional Structure

Figure 3:
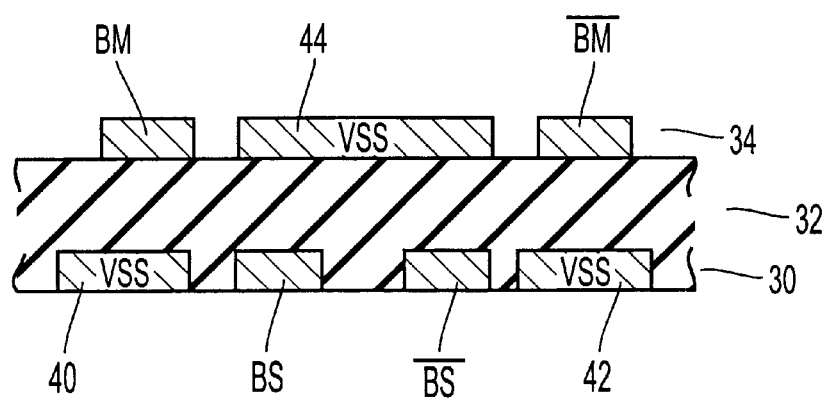
FIG. 3 is a partial cross-sectional view taken along plane A—A of FIG. 1.

FIG. 3 is a partial cross section taken along plane A—A of FIG. 1, and shows positions where the pair of bit lines BM and $\overline{\text{BM}}$ and the pair of bit lines BS and $\overline{\text{BS}}$ are formed.

As shown in FIG. 1, as viewed in a plan view, a space W1 between the pair of bit lines BM and $\overline{\text{BM}}$ is greater than a space W2 between the pair of bit lines BS and $\overline{\text{BS}}$, and the pair of bit lines BS and $\overline{\text{BS}}$ are disposed between the pair of bit lines BM and $\overline{\text{BM}}$.

As shown in FIG. 3, the pair of bit lines BS and $\overline{\text{BS}}$ are disposed in a metal second layer 30 on a semiconductor substrate that is not shown, and the first pair of bit lines BM and $\overline{\text{BM}}$ are disposed in a metal third layer 34 above the metal second layer 30 having an interlayer dielectric film 32 interposed therebetween.

FIG. 3 does not show a layer below the metal second layer. However, a metal first layer is used to connect and wiring to sources and drains of transistors such as MOS transistors that are formed on the semiconductor substrate, and the metal second layer 30 is formed over the metal first layer through an interlayer dielectric film.

Furthermore, the pair of bit lines BS and $\overline{\text{BS}}$ formed in the metal second layer 30 and the pair of bit lines BM and $\overline{\text{BM}}$ formed in the metal third layer 34 are disposed at positions that are not mutually opposite to one another with the interlayer dielectric film 32 being interposed therebetween.

Further, VSS wiring layers 40 and 42 are provided opposite to the respective pair of bit lines BM and $\overline{\text{BM}}$ through the interlayer dielectric film 32, and disposed in the metal second layer 30 that is the same layer in which the pair of bit lines BS and $\overline{\text{BS}}$ are provided.

Also, a VSS wiring layer 44 is provided opposite to the pair of bit lines BS and $\overline{\text{BS}}$ through the interlayer dielectric film 32, and disposed in the metal third layer 34 that is the same layer in which the pair of bit lines BM and $\overline{\text{BM}}$ are provided.

Cross-Sectional Structure of Comparison Example

Figure 4:
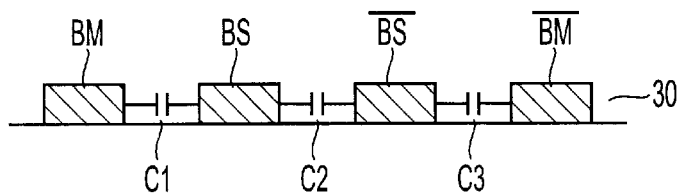
FIG. 4 is a partial cross-sectional view of a comparison example to be compared to FIG. 3.

FIG. 4 shows in part a conventional cross section of a 2-port RAM shown in FIG. 1. As shown in FIG. 4, a pair of bit lines BM and $\overline{\text{BM}}$ and a pair of bit lines BS and $\overline{\text{BS}}$ are disposed in the same layer such as a metal second layer.

Description of Operation of Comparison Example

With respect to the 2-port RAM having the structure described above, the same operation example is described. In other words, the description is made with respect to an operation in which any two of the multiple memory cells M11, M12, . . . M1n in the first column shown in FIG. 1 are selected. In this case, it is assumed that data is written in one of the selected memory cells and data is read out from the other of the selected memory cells.

In a more concrete example, a case is considered in which, when data (for example, HIGH) read out from the memory cell M1n is sensed by a sense amplifier (not shown), a state of writing HIGH data in the memory cell M11 is switched to a state of writing LOW data in the memory cell M12.

Figure 5:
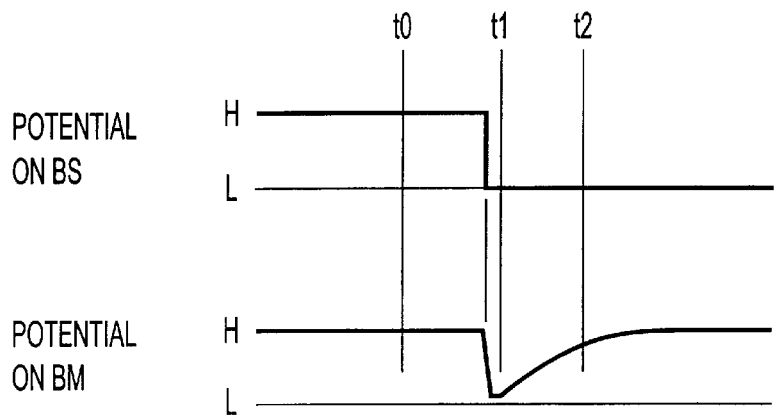
FIG. 5 is a waveform diagram to describe malfunctions of the comparison example having the structure shown in FIG. 4.

FIG. 5 schematically shows a characteristic profile of potential on each of the bit line BS and the bit line BM in the comparison example shown in FIG. 4.

Referring to FIG. 5, when the potential on the bit line BS shifts from HIGH to LOW, the read potential on the bit line BM temporarily drops from HIGH, and thereafter gradually returns to HIGH.

The transient change of the read potential on the bit line BM is assumed to be resulted from the fact that, for example, the bit lines BM and BS that are formed at an interval of 0.25 μm are mutually capacitively coupled by a coupling capacitor C1.

Initially, at time t0 shown in FIG. 5, a charge in the coupling capacitor C1, that is formed between the bit lines BM and BS, is stable. At time t1, the potential on the bit line BS is switched from HIGH to LOW; and at this moment, a positive charge flows from the bit line BM to the coupling capacitor C1. As a result, at time t1 shown in FIG. 5, the potential on the bit line BM transiently drops. During the period in which a charge is charged in the coupling capacitance C1, the amount of charge flowing from the bit line BM to the coupling capacitance C1 reduces, and therefore the potential on the bit line BM gradually revives at time t2 shown in FIG. 5.

It is noted that the higher the access speed to the 2-port RAM, the shorter the time to sense the potential on the bit line BM.

In this instance, when the period of sensing the potential on the bit line BM is set at a timing that includes time t1 shown in FIG. 5, data that is originally HIGH may be erroneously recognized as LOW.

Such a phenomenon likewise occurs between the bit lines $\overline{\text{BS}}$ and $\overline{\text{BM}}$, and data that is originally LOW may be erroneously recognized as HIGH due to the presence of a coupling capacitor C3 shown in FIG. 4.

A coupling capacitor C2 is also formed between the bit lines BS and $\overline{\text{BS}}$ shown in FIG. 4. However, a problem that may result from the coupling capacitor C2 is not serious. This is because changes in the potential on the bit lines BS and $\overline{\text{BS}}$ are synchronized, and not in asynchronous, such as in the potential changes on the bit lines BM and BS and the potential changes on the bit lines $\overline{\text{BS}}$ and $\overline{\text{BM}}$. In particular, when the pair of bit lines BS and $\overline{\text{BS}}$ are exclusively used to write data, the presence of the coupling capacitor C2 can be further ignored. This is because the current drivability of a transistor that is used to write data is normally greater than that of a transistor that is used to read data.

The capacitance value of the coupling capacitors C1–C3 becomes greater as the length of the bit lines BM and BS becomes longer, and the length becomes greater as the memory capacity of a 2-port RAM becomes greater. Also, the capacitance value becomes greater as the gap between the bit lines BM and BS becomes narrower, and the gap becomes narrower as the semiconductor process is further miniaturized.

The inventors of the present invention confirmed the above-described error data detection when the semiconductor process of 0.25 μm or less is used, and the number of memory cells in the column direction shown in FIG. 1 exceeds 280.

Description of Operation of Embodiment

It has been confirmed that, when the cross-sectional structure of the comparison example shown in FIG. 4 is enhanced to the cross-sectional structure shown in FIG. 3, error data detection associated with the above-described capacitor coupling can be prevented without increasing the area occupied by the memory cells.

In the structure shown in FIG. 3, first, the interlayer dielectric film 32 is interposed between the bit lines BM and BS. As a result, the space between the bit lines BM and BS shown in FIG. 3 is wider than the space between the bit lines BM and BS of the comparison example shown in FIG. 4. Moreover, the bit lines BM and BS shown in FIG. 3 are formed through the interlayer dielectric film 32 in positions that are not mutually opposite to each other. Therefore, the space between the bit lines BM and BS can be made greater than the film thickness of the interlayer dielectric film 32.

By widening the distance between the bit lines BM and BS and the distance between the bit lines $\overline{BS}$ and $\overline{BM}$, the capacitance value of the coupling capacitors C1 and C3 shown in FIG. 4 can be reduced. As a result, error data detection associated with the capacitor coupling can be prevented.

Also, in the structure shown in FIG. 3, the space between the pair of bit lines BM and $\overline{BM}$ is also made wider. This structure is particularly preferable when the pair of bit lines BM and $\overline{BM}$ is exclusively used as lines to read data. This is because each of the bit lines BM and $\overline{BM}$, through which minute current flows, can be disposed as far away as possible from other wirings to avoid their deteriorate influence.

Furthermore, as shown in FIG. 3, the VSS wiring layer 44 is provided between the pair of bit lines BM and $\overline{BM}$. Due to the shield effect provided by the VSS wiring layer 44, mutual influences by the pair of bit lines BM and $\overline{BM}$ can be further reduced. Therefore, this structure is also effective when the pair of bit lines BM and $\overline{BM}$ are exclusively used as lines to read data.

In the structure shown in FIG. 3, in addition to the VSS wiring layer 44, the VSS wiring layers 40 and 42 are also formed on both sides of the pair of bit lines BS and $\overline{BS}$. As a result, the VSS wiring layers are formed close to each of the bit lines of the pairs of bit lines BS and $\overline{BS}$, and BM and $\overline{BM}$, such that an influence of one bit line that may affect another bit line is reduced by the shield effect provided by the VSS wiring layers.

Figure 6:
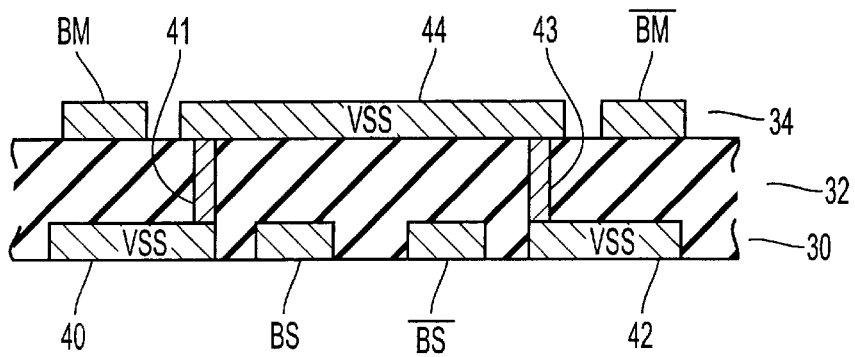
FIG. 6 is a partial cross-sectional view of another cross-sectional structure different from the one shown in FIG. 3.

To further enhance the shield effect, as shown in FIG. 6, vias 41 and 43 may preferably be provided to connect the VSS wiring layer 40 and 42 in a lower layer to the VSS wiring layer 44 in an upper layer.

It is noted that, in the structures shown in FIG. 3 and FIG. 6, the pair of bit lines BS and $\overline{BS}$ may be disposed in an upper layer above the interlayer dielectric film 32, and the pair of bit lines BM and $\overline{BM}$ may be disposed in a lower layer below the interlayer dielectric film 32.

Description of Other Structures

Figure 7:
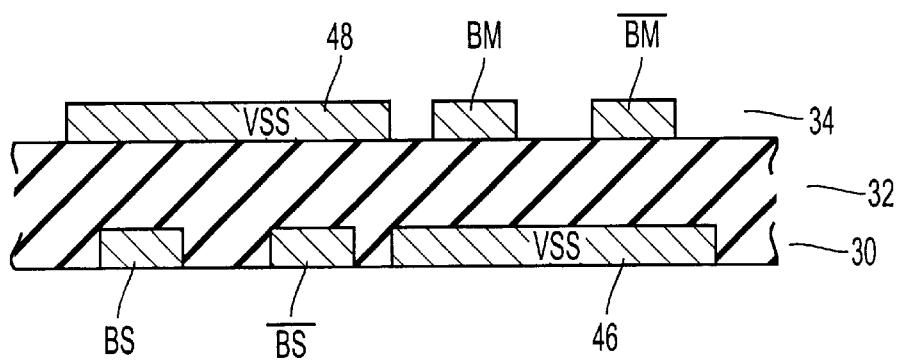
FIG. 7 is a partial cross-sectional view of still another cross-sectional structure different from those shown in FIG. 3 and FIG. 6.

FIG. 7 shows a cross-sectional structure different from those of FIG. 3 and FIG. 6. In FIG. 7, a pair of bit lines BS and $\overline{BS}$ and a VSS wiring layer 46 are disposed in a metal second layer, and a pair of bit lines BM and $\overline{BM}$ and a VSS wiring layer 48 are disposed in a metal third layer 34 above an interlayer dielectric film 32.

In FIG. 7, unlike those shown in FIG. 3 and FIG. 6, the space between the pair of bit lines BS and $\overline{BS}$ and the space between the pair of bit lines BM and $\overline{BM}$ are substantially the same. Also, the pair of bit lines BS and $\overline{BS}$ are disposed opposite to the VSS wiring layer 48, and the pair of bit lines BM and $\overline{BM}$ are disposed opposite to the VSS wiring layer 46. This would provide effects substantially similar to those provided by the structure shown in FIG. 3.

Figure 8:
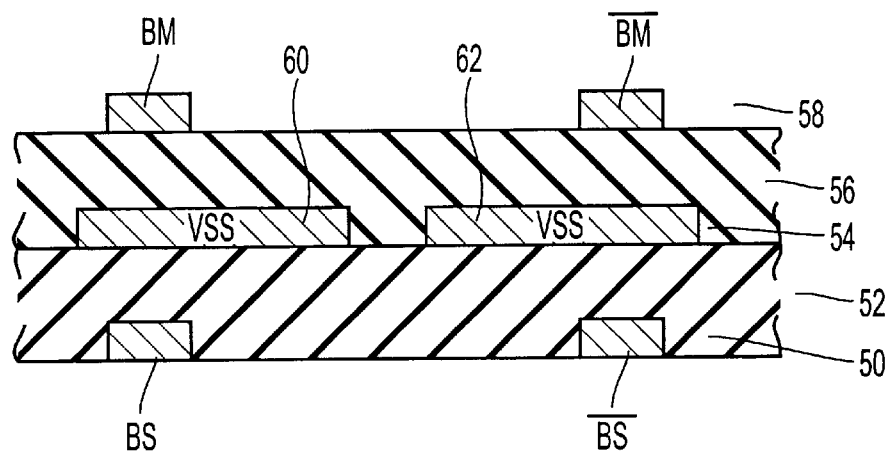
FIG. 8 is a partial cross-sectional view of still another cross-sectional structure different from those shown in FIG. 3, FIG. 6 and FIG. 7.

FIG. 8 shows a cross-sectional structure different from those of FIG. 3, FIG. 6 and FIG. 7. As shown in FIG. 8, for example, a pair of bit lines BS and $\overline{BS}$ are disposed in a metal second layer 50, and a first interlayer dielectric film 52 is formed thereon. VSS wiring layers 60 and 62 are provided in a metal third layer 54, a second interlayer dielectric film 56 is formed thereon, and a pair of bit lines BM and $\overline{BM}$ are formed in a metal fourth layer 58 on the second interlayer dielectric film 56.

The bit lines BS and BM are disposed opposite to each other with the VSS wiring layer 60 being interposed therebetween, and the bit lines $\overline{BS}$ and $\overline{BM}$ are also disposed opposite to each other with the VSS wiring layer 62 being interposed therebetween.

Even in this structure, the first and second interlayer dielectric films 52 and 56 and the VSS wiring layer 60 are interposed between the bit lines BS and BM, such that the distance between the bit lines BS and BM is widened, and therefore the capacitance value of the coupling capacitor C1 can be reduced. Furthermore, the bit lines BS and BM are shielded from each other by the VSS wiring layer 60. The same things apply to the bit lines $\overline{BS}$ and $\overline{BM}$.

Furthermore, in the structure shown in FIG. 8, the space between the pair of bit lines BM and $\overline{BM}$ can also be widened in a similar manner as in FIG. 3. In addition, there is an advantage in that the space between the pair of bit lines BS and $\overline{BS}$ can also be widened.

The present invention is not limited to the embodiments described above, but many modifications can be made within the scope of the subject matter of the present invention. The present invention is generally applicable to any memory device whose data read lines and data write lines are possibly disposed close to one another. The memory devices of this type are normally those that are used to read and write data with an MPU, but can be other memory devices. For example, those in which reading data from memories is regularly performed for display or the like are also acceptable.

What is claimed is:

1. A semiconductor device, comprising:
    a plurality of memory cells arranged in a column direction;
    a plurality of word lines arranged along a row direction, and capable of asynchronously selecting any two memory cells of the plurality of memory cells;
    a first data line extending along the column direction and used by the plurality of memory cells, the first data line being connected to a selected one memory cell of the plurality of memory cells;
    a second data line extending along the column direction and used by the plurality of memory cells, the second data line being connected to another selected memory cell of the plurality of memory cells, the first data line and the second data line being formed in different layers; and
    an interlayer dielectric film being interposed between the first and second data lines.

2. The semiconductor device according to claim 1, the first data line and the second data lines being formed in positions not directly opposing each other with the interlayer dielectric film being interposed therebetween.

3. The semiconductor device according to claim 1, further comprising:
    a first wiring layer that is set at a ground potential and disposed in the same layer as the first data line directly opposed to the second data line with the interlayer dielectric film being interposed therebetween; and a second wiring layer that is set at a ground potential and disposed in the same layer as the second data line directly opposed to the first data line with the interlayer dielectric film being interposed therebetween.

4. The semiconductor device according to claim 3, further comprising a via that connects the first and second wiring layers.

5. The semiconductor device according to claim 1, the interlayer dielectric film including first and second interlayer dielectric films, and further comprising a wiring layer that is set at a ground potential and provided in a region defined by the first data line and the second data line directly opposing each other and between the first and second interlayer dielectric films.

6. The semiconductor device according to claim 1, the first data line including a first pair of bit lines through which signals having mutually different logics are transmitted.

7. The semiconductor device according to claim 6, the second data line including a second pair of bit lines through which signals having mutually different logics are transmitted.

8. The semiconductor device according to claim 1, the first data line including a first pair of bit lines through which signals having mutually different logics are transmitted, the second data line including a second pair of bit lines through which signals having mutually different logics are transmitted, and as viewed in a plan view, a gap defined between the bit lines of the first pair of bit lines being wider than a gap defined between the bit lines of the second pair of bit lines, and the second pair of bit lines being disposed between the first pair of bit lines.

9. The semiconductor device according to claim 8, the first pair of bit lines being exclusively used to read data, and the second pair of bit lines being exclusively used to write data.

10. The semiconductor device according to claim 8, further comprising a first wiring layer that is set at a ground potential and provided in the same layer as the first pair of bit lines and between the first pair of bit lines.

11. The semiconductor device according to claim 10, further comprising second and third wiring layers that are set at a ground potential and provided in the same layer as the second pair of bit lines, and disposed opposite to each other respectively with the respective bit lines of the first pair of bit lines and the interlayer dielectric film being interposed therebetween.

12. The semiconductor device according to claim 11, the first and second wiring layers and the first and third wiring layers being connected by vias, respectively.

13. The semiconductor device according to claim 1, wherein the semiconductor device is manufactured using a deep sub-micron process for lines and space having a minimum width of 0.25 $\mu$m or less.

14. The semiconductor device according to claim 1, the number of the plurality of memory cells arranged in the column direction being 280 or greater.

15. The semiconductor device according to claim 1, the minimum width of lines and spaces being 0.4 $\mu$m or less.

* * * * *